United States Patent [19]

Ehnholm

[11] Patent Number: 5,488,950
[45] Date of Patent: Feb. 6, 1996

[54] STABILIZER FOR MRI SYSTEM

[75] Inventor: Gösta J. Ehnholm, Helsinki, Finland

[73] Assignee: Picker Nordstar Inc., Helsinki, Finland

[21] Appl. No.: 212,426

[22] Filed: Mar. 14, 1994

[30] Foreign Application Priority Data

Mar. 18, 1993 [GB] United Kingdom ............ 9305601

[51] Int. Cl.$^6$ .................................................. A61B 5/055
[52] U.S. Cl. ................... 128/653.1; 128/653.2; 324/316
[58] Field of Search .................. 128/653.2, 653.5, 128/653.1; 324/318, 322, 316

[56] References Cited

U.S. PATENT DOCUMENTS

| 4,417,209 | 11/1983 | Hounsfield | 324/309 |
| 4,623,843 | 11/1986 | Macovski | 324/309 |
| 4,719,425 | 1/1988 | Ettinger | 324/309 |
| 5,184,076 | 2/1993 | Ehnholm | 324/318 |
| 5,302,898 | 4/1994 | Pethig et al. | 324/316 |
| 5,309,103 | 5/1994 | Friedburg | 324/318 |

OTHER PUBLICATIONS

J. of Magnetism & Magnetic Materials 54–57 (1986) 1315–1316 Title: Application of the Organic Conductor (Fluoranthene).

+$PF_6^-$ as an ESR Magnetic Field Probe Author(s): Dormann et al.

Applied Physics A30, 227–231 (1983); Title: Gaussmeter Application of an Organic Conductor; Author(s): Dormann et al.

IEEE Transaction on Instrumentation and Measurement, vol. IM–26, No. 3, Sep. 1977; Title: The Dynamic Response of a Resonant Frequency Tracking System; Author(s): Markowski et al.

Primary Examiner—William E. Kamm
Assistant Examiner—Brian L. Casler
Attorney, Agent, or Firm—T. B. Gurin; J. J. Fry

[57] ABSTRACT

An electron spin resonator (ESR) is used to compensate for temporally varying instabilities in the main magnetic field $B_o$ of a nuclear magnetic resonance imaging apparatus during the derivation of NMR imaging data from an object being imaged. The ESR monitor is placed at a point outside but close to the object such that the ESR monitor is affected by the temporally varying fields. Variances across the ESR caused by gradient fields are compensated for such that the output of the ESR is independent of the strength of the gradient fields. The ESR output is used to reduce the influence of said instabilities on the imaging data.

20 Claims, 2 Drawing Sheets

STABILIZER FOR MRI SYSTEM

This invention relates to imaging systems using magnetic resonance.

Nuclear magnetic resonance (NMR) has been in general use for medical imaging in magnetic resonance imaging (MRI) apparatus for more than ten years. The techniques used are described in numerous books and articles and there are periodical magazines devoted to it. In these many MRI machines or scanners are described.

A common feature of MRI scanners is that the object to be imaged, often a patient, is placed in a DC magnetic field $B_o$, produced by a magnet, onto which are superposed a set of field gradients, produced by gradient coils. The gradients $G_x$, $G_y$ and $G_z$, represent linear variations in $B_o$ along the x, y and z-axis, respectively. They are used to obtain positional information for the magnetically resonating matter, usually protons, in the imaged object by frequency modulating the resonance. Thus, for obtaining information in e.g. the x direction the x-gradient $G_x$ can be applied during acquisition of resonance signal. The signal is produced with the aid of RF coils, which excite the resonance and act as receivers. It is analyzed for harmonic content (Fourier transformed), which reveals the relative amount of proton signal coming from each value of x, i.e. the signal distribution along that direction.

The literature describes numerous ways of using this property to form 2- or 3-dimensional images of the region of interest by employing special imaging sequences, which are all based on tagging or coding the NMR-signal with gradients in the x, y and z direction.

For these methods to work well it is required that $B_o$ be stable during the imaging sequence, which has a typical duration of a few seconds to fifteen minutes. The required stability is quite high, and typically changes of 0.1 to a few parts per million (ppm) relative change can degrade the image. Sequences differ in their resistance to field instabilities but often the more sensitive ones have some other advantages, such as less noise in the image. The stability requirement is thus quite severe, and is especially difficult to handle in resistive and permanent magnets, as opposed to superconducting ones.

The instabilities may be caused by external disturbances, e.g. moving ferrous masses such as elevators and so on, and imperfections in the magnet system. In resistive magnets the latter comprise instabilities in the magnet current and thermal contraction of the coils, which affects the ratio of field to current. In permanent magnets the temperature affects both the dimensions of the magnet and the flux produced by its material and thus this type of magnet is quite sensitive to thermal fluctuations.

Superconductive magnets have fewer stability problems. Internally they operate at a constant temperature and in the persistent mode without a supply current. Externally they are shielded against fluctuations in the field from external sources. They are, however, more expensive and difficult to maintain. They are also incapable of rapid field variations, which are desirable for some applications.

The problem of a severe stability requirement has been addressed in U.S. Pat. No. 4,623,843 of Macovski, and U.S. Pat. No. 4,417,209 of Hounsfield. They teach how to measure the actual $B_0$-field in the presence of unwanted fluctuations $\Delta B_o$, that is $B_0 + \Delta B_o$, and how to use the measured signal to compensate for $\Delta B_o$. This is done by NMR, using separate reference samples outside the imaged object but inside the $B_o$ field region. The reference samples can be excited separately or by the same RF excitation held as that of the object. The reference signal from these samples gives the NMR frequency $f_o + \Delta f_o$, which is proportional to $B_o + \Delta B_o$. The derived frequency is used for demodulating the NMR signal received from the object, thus compensating for the instabilities $\Delta B_o$ during reception. Methods for compensating $B_o$ during excitation of the object are also described.

Such systems for compensating $\Delta B_o$ have several basic flaws, which have more or less inhibited their use. The gradients used during the imaging sequence cause additional fields at the points where $B_o$ is being measured, and they change very rapidly with time. These fields are zero only in the middle point of the magnet, but this point is inaccessible because it is inside the patient. This fact makes it impossible to use a continuously measuring NMR-probe, as it takes seconds or more for such a probe to lock onto a new field value. The NMR $B_o$ sensors therefore have to be used in the pulsed mode, which means that the compensation signal is available only during part of the time, when pulsing the probe. This complicates its use because it has to be co-ordinated with the imaging pulse sequence to provide signal when needed.

Another problem with the gradients is that they decrease the obtainable signal from the sensor, because they give a distribution of fields across its sensitive volume. This will result in a shortening of the duration of the nuclear free precession signal obtained for each pulse. The duration cannot be made too short, because the signal must be available during the readout of image data. This means that the sensitive volume of the sensor cannot be very large. As a consequence the signal-to-noise (s/n) ratio of the NMR-sensor is at best only a little better than needed and at worst it can degrade the final image quality.

The present invention discloses how the shortcomings of the NMR method for field compensation can be avoided. Instead of NMR another magnetic resonance method namely electron spin resonance (ESR) is employed.

Viewed from one aspect the present invention provides a method for deriving NMR imaging data from an object using a static field and applied gradient fields, comprising the steps of monitoring the static field with an ESR magnetometer at a point outside but close to the object, compensating for the influence of said applied gradient fields on said ESR magnetometer to make its output independent of their strength, and using the output of the ESR magnetometer to reduce the influence of field instabilities on said imaging data.

Viewed from another aspect the present invention provides MRI apparatus comprising means for producing a static field, means for providing varying gradient fields, an ESR magnetometer to monitor the static field, and means for using the output of the ESR magnetometer to reduce the influence of field instabilities on imaging data.

ESR has been used for compensating fields of magnets before. Dormann et al. describes such systems in J. of Magnetism and Magn. Mat. 54–57 (1986). Reference is also made to Dormann et al. in Applied Physics A 30, 227–231 (1983). They use ESR, however, to regulate the field in a simple magnet used for NMR or ENDOR spectroscopy, as opposed to an MRI scanner, which because of the time-dependent imaging gradients is a much more demanding environment.

A preferred embodiment of the invention will now be described by way of example and with reference to the accompanying drawings, in which.

The present invention is based on the use of electron spin resonance (ESR) for detecting magnetic field strength. This method is known for those familiar with the art, and is based on using paramagnetic electrons, present in certain substances, which resonate in a magnetic field with a frequency proportional to the field strength. The resonance frequency is much higher, by approximately the factor 658, than for protons resonating in the same field. Thus, for typical fields of interest with strengths between 0.01–0.3 Tesla the frequency is approximately in the range of 0.3–8 GHz.

The ESR phenomenon manifests itself by a strong relative increase in the real and imaginary parts of the complex susceptibility of the ESR substance at and around the resonant frequency. The width of this frequency band is termed the ESR linewidth (LW) and for precise determination of the magnetic field strength one needs a narrow linewidth. For a typical sample, which could be of the order of 3 mm across, one requires that the LW be approximately equal to or less than the frequency spread caused by typical system field gradients acting on the sample. In practical terms the LW, in field units, should be less than 100 micro Tesla, and preferably less than 10 µT. A suitable substance is TCNQ (N-methyl-pyridinium), which in addition to a narrow LW has other desirable properties: It is relatively inexpensive, it is chemically stable, and it is a solid.

It also has a resonance frequency which is relatively independent of temperature. Measurement has shown that it shifts less than 0.2 parts per million (ppm) for a 1 degree K change in temperature. Other suitable substances are the organometals described by E. Dormann et. al. in J. of Magnetism and Magnetic Materials 54–57 (1986) 1315–1316, which have even narrower LW's.

The ESR resonance frequency is normally detected by coupling the sample to the magnetic field of a resonator and measuring its effect on either the Q-value or the centre frequency of the resonator. This can be accomplished in several ways. One method is to amplify the resonator signal, then limit its amplitude and coupling back the limited signal so as to make the system into an oscillator. The signal strength before the limiter then gives a measure of the Q-value, and the signal frequency is pulled towards the ESR-frequency. This method can be developed to yield the desired information.

The preferred method explained next is to feed an oscillating signal to the resonator and measure how it is either reflected from or transmitted via the same. Of these methods the latter one is usually less sensitive to coupling parameters. Thus the incoming signal line couples weakly to the resonator, as does the outgoing one, but the direct coupling between the two is made so small as to become insignificant compared to the one mediated via the resonance.

Figure 1:
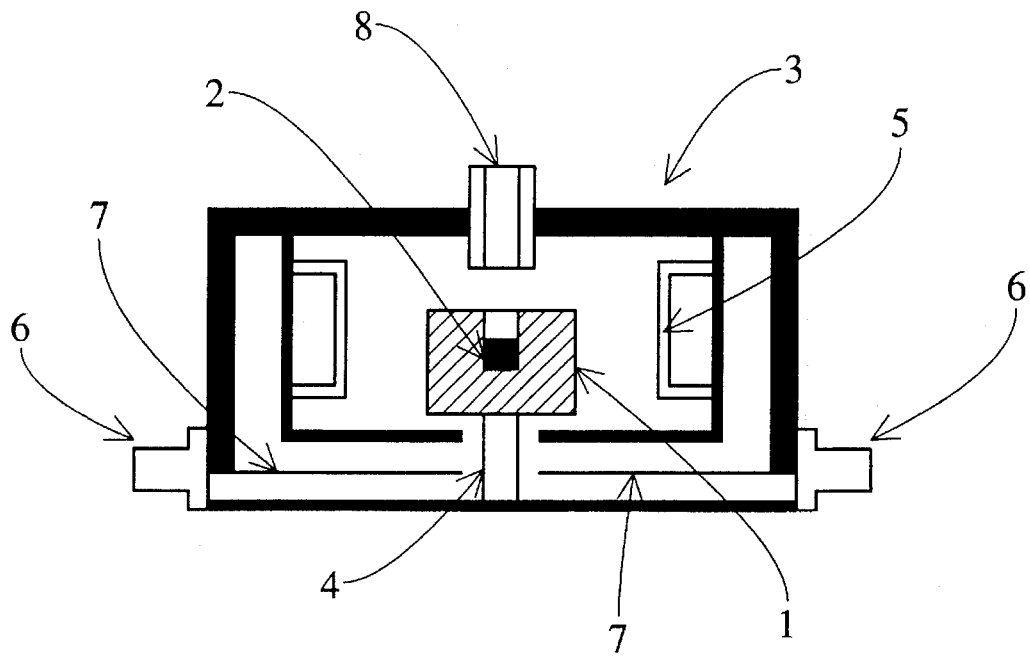
FIG. 1 is a section of a dielectric resonator.

Before describing the signals more in detail reference will be made to the preferred type of sensor, which is based on a so called dielectric resonator (see FIG. 1). This resonator type is well known for those familiar with the art, being commonly used in oscillators and filters. A typical dielectric resonator for the frequency range 1–10 GHz comprises a simple cylindrical piece of a dielectric material with low electrical loss and a rather high dielectric coefficient, into which a hole along its axis can be drilled for the ESR-sample. For 2.7 GHz, corresponding to 0.1 T field, the resonator (1) is 20 mm in diameter, approximately 11 mm high and of a material with a dielectric coefficient of 36. The sample (2), which senses the field, sits in the bottom of a 3 mm diameter bore extending axially to the centre of the piece, the sample's height being equal to its diameter. The dielectric resonator is housed in a metal box (3) made of nonmagnetic material (brass is suitable), and glued to its bottom on a spacer (4), e.g. a quartz rod, so as to be supported in the middle of the box. Around the resonator is a saddle shaped coil (5), which is used to produce a modulating magnetic field on the sample, perpendicular to the resonator axis. The feed and sense signals are coupled to and from the resonator using plugs (6), which are connected to micro-strip lines (7), on a printed circuit board. These strip lines form quarter-wave resonance circuits at the used frequency. By adjusting their length and position a suitable coupling to the resonator can be found.

The resonator is used in the $TE_{01\delta}$ mode, with the magnetic field along its axis and the electric field lines circling around it. Another possible mode is the hybrid $HEM_{11\delta}$ mode, which has a magnetic field perpendicular to the resonator axis. The advantage with the former mode is that it has a good Q-value and is easy to distinguish from higher modes.

The latter, hybrid, mode comes in pairs, with one in the x-direction, and the other one in the y-direction. The feed and sense lines can then each be coupled to its own mode, with the sample coupling signal from one mode to the other one. This has the advantage of isolating the noise of the feed oscillator from the sense preamplifier, with potentially a better signal to noise (s/n) ratio. This is important at low fields (and frequencies) where the signal available from the sample is small. The disadvantage is that with two modes instead of one the system becomes more laborious to tune.

Figure 2:
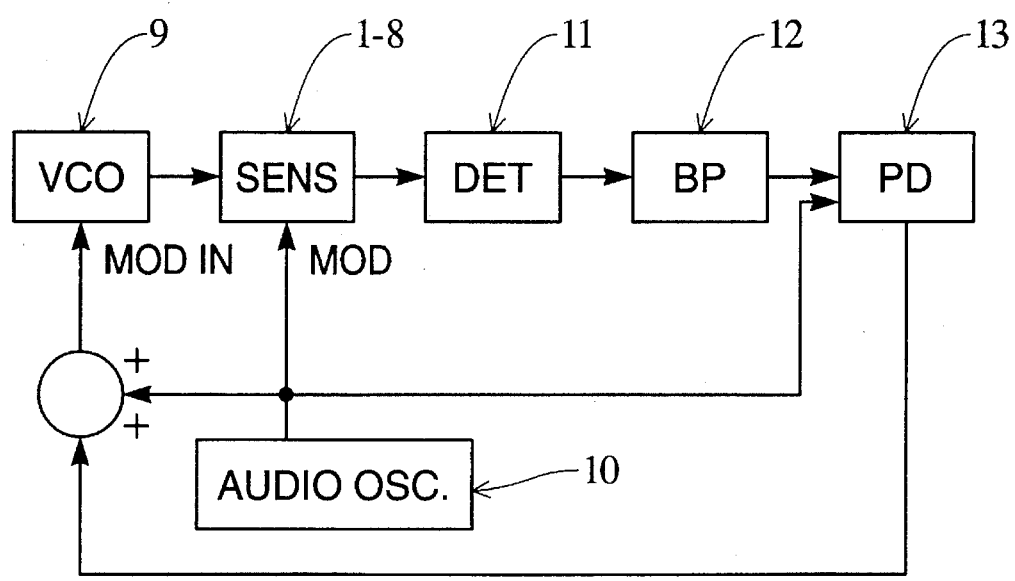
FIG. 2 is diagram illustrating the system.

FIG. 2 shows the preferred way of monitoring the sensor, which is here represented by the box "SENS". The method is based on the effect of ESR on the resonance frequency of the dielectric resonator. The measuring circuit contains a voltage controlled oscillator VCO (9), whose output gives an exciting signal which is fed to the resonator via one of the plugs (6). The excited paramagnetic electrons will then affect the output signal of the resonator. The change in the output signal, from the second plug (6), is further processed to form a control voltage, which is coupled to the VCO input such a way as to force the VCO frequency towards the centre frequency of the resonator. As a result the VCO output frequency will be "locked" to said centre frequency, which, in its turn, is a function of the ESR-frequency and thus of the field. The explained principle of locking the VCO to a resonator is explained in detail in an article by Markowski, MacDonald and Stuchly.

The locking is implemented using a modulation technique, which makes the system less susceptible to drift. This is done by amplitude modulating the resonator output signal. There are two ways of doing this. One method is to feed the modulating signal from the modulation oscillator (10) to the "rood" input of the resonator, which is connected to coil (5) in FIG. 1 and produces a local magnetic field on the sample. The ESR resonance will then shift in pace with the modulating signal. The second method is to feed the modulating signal to the input of the VCO, so as to frequency modulate the VCO output. In both cases the resonator output signal will be amplitude modulated with a modulation depth which (for small signals) is proportional to the difference between the VCO and resonator centre frequencies. Both methods can be used simultaneously, as indicated in FIG. 2; this has certain advantages which will be explained further on.

The output signal is demodulated in the detector (11), passed through an ac amplifier and band limited filter (12) and fed to a phase sensitive detector (PD, 13). The output of PD is proportional to the offset between the centre frequencies of the resonator and the VOC, as long as it is small. Feeding it back to the input of the VCO nulls the offset, locking the two frequencies together.

The explained method of producing an output signal frequency which is locked to the ESR resonance is only an example. As explained above there are other methods to obtain the same result. It is not essential for the invention to use the particular method described above.

The locked frequency thus comprises the primary output of the device, and is used either to compensate or to null $\Delta B_o$. This can again be accomplished in two ways. The first method, as described by Macovski in the cited patent U.S. Pat. No. 4,623,843, is to derive from it the frequency $f_o+\Delta f_o$, which corresponds to the proton frequency at field $B_o+\Delta B_o$. This can be done by dividing the VCO frequency by the ratio of electron spin and proton resonance frequency for the same field (approximately 658). Mixing down of the received MRI signals with this will give the desired compensation.

Figure 3:
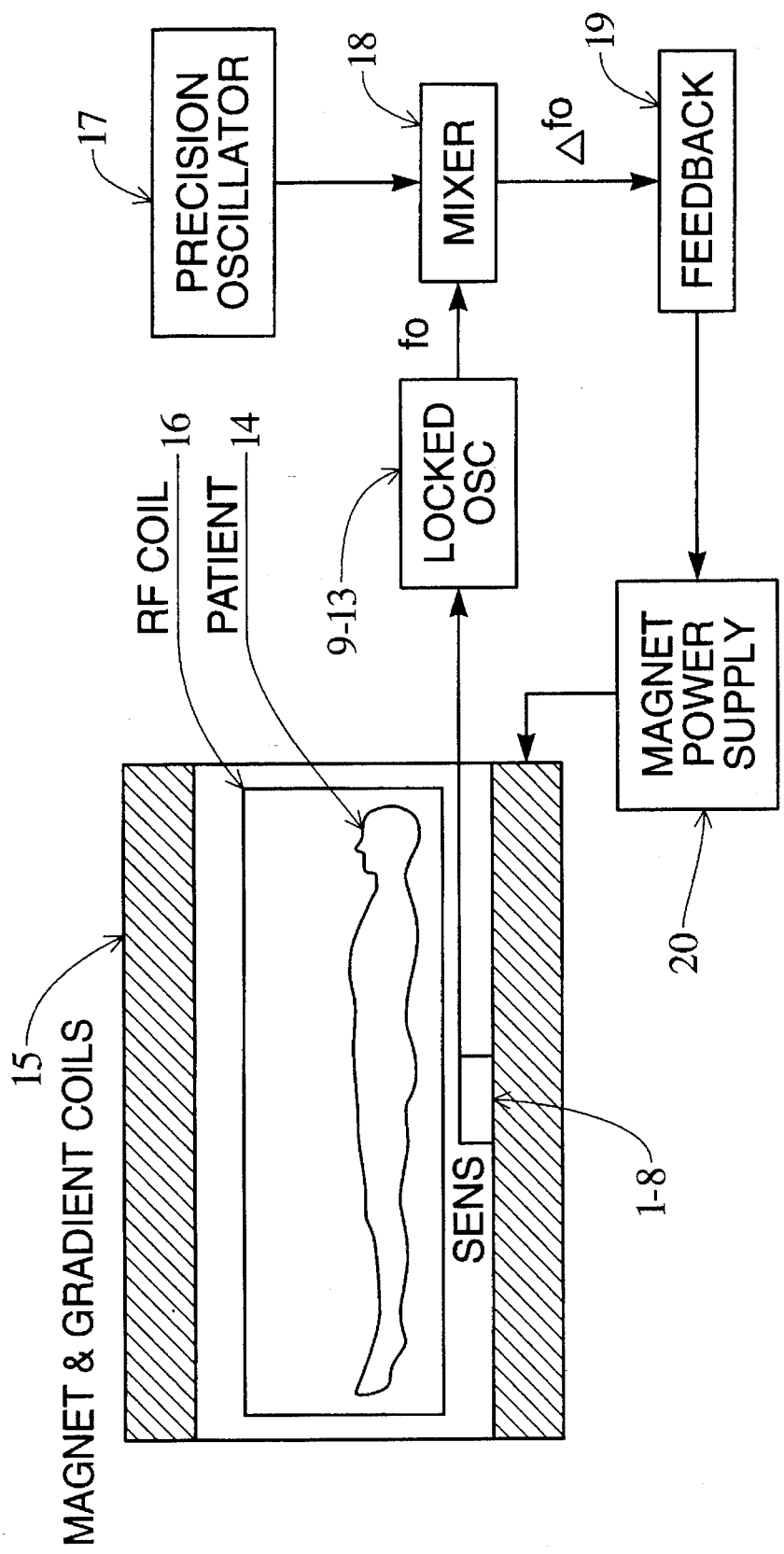
FIG. 3 is a further diagram of the system.

The second method, which is preferred, is to derive from the VCO frequency a signal which is proportional to $\Delta B_o$ and to use this to stabilize the field by feedback. The principle is shown in FIG. 3. The sensor (SENS) has been placed under the patient (14) in apparatus including magnet and gradient coils (15) and an RF coil (16), in the middle of the magnet where two of the gradient coils do not produce fields. It is connected to the frequency locked oscillator (Locked OSC, 9–13), which outputs the centre frequency $f_o$ of the resonator, loaded by the sample. This output is mixed down with the frequency corresponding to the desired value of $B_o$ produced by a stable oscillator (17). The difference frequency $\Delta f_o$ is used by the feedback circuit to produce a correcting signal to the magnet power supply (20), which changes the field so as to null $\Delta f_o$.

Before mixing the frequencies can be divided by some convenient factor; this is usually expedient to bring them to a range where components (such as the mixer or precision oscillator) are inexpensive.

An advantage of this method is that the dielectric resonator can operate at a constant frequency, which makes it less susceptible to many non-ideal situation, especially to "frequency pulling" by the resonator.

By "frequency pulling" is meant the following problem:

The frequency $f_o$, which is used to derive the feedback signal to the power supply, corresponds to the resonance of the loaded resonator, which, in turn, depends on two factors: The ESR frequency of the sample, which is the parameter being measured, but also the centre frequency of the unloaded dielectric resonator, in the absence of any ESR. The influence of the latter on the measurement has to be eliminated. To a first approximation this is accomplished by operating the resonator at constant frequency, as explained above. As long as it can be kept constant it will have no influence except that it affects the constant of proportionality between $\Delta B_o$ and $\Delta f_o$.

If, however, the resonance frequency of the unloaded resonator changes it will have the same effect as a change in magnetic field on the resonance and thus on $\Delta f_o$, and in this way it will produce a false output signal. This can be caused by thermal effects. A typical temperature co-efficient of the resonance of a dielectric resonator 1 ppm/Kelvin, which is too large as compared to the needed precision for the field detection. The influence on $\Delta f_o$ can be minimized by making the resonance curve of the bare resonator wider than the width of the ESR resonance, and by operating at the centre of the dielectric resonance. The former is accomplished by making a tight enough coupling between strip lines (7) and dielectric cylinder (1). For a $B_o$ of 0.1 Tesla there are the following preferred values: The centre frequency is about 2.7 GHz. Using the ESR substance mentioned above the ESR linewidth is about 2 mHz. The dielectric resonator is coupled with strip-lines tightly enough to bring its Q-value down to 200–500 when connecting the VCO and the detector to the plugs (6) (the "mod" input indicated in FIG. 2 is to coil 5 and does not affect the Q-value). Going to much lower Q's decreases the output signal level to the detector which eventually increases its relative noise content. For values exceeding 1000 the dielectric resonance width becomes more narrow than the ESR line-width which increases the frequency pulling effect.

There are additional ways to eliminate the influence of the frequency pulling, based on the use of double modulation. As explained before the modulating signal from oscillator (10) can be applied either to the VCO control input or to the field modulating coil (5). In the former case the effect of an increase of the dielectric resonance frequency will be seen in the same way as an increase in the magnetic field: The VCO centre frequency will increase. If the modulation is applied to the field coil, however, an increase in the dielectric resonance frequency will produce a decrease in VCO frequency. Therefore a combination of field and frequency modulation can be found that nulls the influence of a shift in the dielectric resonance.

It is obviously not essential that the resonator used in the sensor is of the dielectric type. For lower frequencies, below or around 1 GHz, a coaxial resonator is a possible alternative. For high frequencies, above 5 GHz, a cavity resonator becomes feasible.

It is desirable for the proper function of the invention that the sensitivity of the ESR magnetometer to the time dependent gradient fields be as small as possible. To this end the ESR sample, which is the part that senses the field, should be as small as possible. A suitable size is about 3 mm for the longest dimension, or even less. It should desirably be placed in position where the fields of two of the gradients pass through zero. Gradients which produce fields on the sensor should be compensated, if possible. This can be done by applying a compensating field on the ESR sample, for instance by a suitable current into the modulating coil (5). If the gradient field is too strong for compensation the alternative is to unactivate the sensor for the duration of the gradient. This is done by adding a sample-and-hold circuit (s/h) at the output of the phase sensitive detector (13). The s/h will be kept in the hold state during the uncompensated gradient, which will "freeze" $f_o$ to its value just before the gradient, and free it immediately after. Usually it is possible to compensate two gradients and use the inactivation method for the third one.

It will be appreciated that viewed broadly from one aspect there is provided a method for deriving NMR imaging data from an object in the presence of a static resonance field, with temporally varying applied gradient fields, and temporally varying instabilities in the static field, comprising the steps of monitoring the field with an ESR magnetometer at a point outside but close to the object and thus affected by said temporally varying fields, eliminating or compensating the influence of said applied gradient fields on said magnetometer to make its output independent of their strength, and using the output of the ESR, magnetometer to reduce the influence of said instabilities on said imaging data.

I claim:

1. A method for reducing image degradation in NMR imaging data acquired from an object in the presence of a static magnetic field, at least one temporally varying applied gradient field, and temporally varying instabilities in the static field comprising the steps of:

monitoring the fields with an ESR magnetometer at a point outside but close to the object and thus affected by said temporally varying instabilities;

eliminating or compensating for an influence of said at least one applied gradient field on said magnetometer; and using an output of the ESR magnetometer to reduce image degradation otherwise caused by said instabilities.

2. A method according to claim 1 where the step of using an output of the ESR magnetometer includes stabilizing the static field by applying feedback from the output of the magnetometer to a field generating device.

3. A method according to claim 2 wherein the step of stabilizing the static field includes:

mixing the output of the magnetometer with a frequency corresponding to a desired value of the static magnetic field;

producing a difference signal corresponding to the difference in frequency between the output of the magnetometer and the frequency corresponding to a desired value of the static magnetic field; and using the difference signal to produce a field generating correcting signal.

4. A method according to claim 2 further including the steps of:

exciting an ESR substance disposed in a resonator with an oscillating signal to produce a resonator signal;

demodulating and filtering the resonator signal, said oscillating signal and said demodulated and filtered resonator signal having an offset therebetween;

generating an offset signal on the output, said offset signal being proportional to the offset between the oscillating signal and the demodulated and filtered resonator signal; and combining the offset signal and the oscillating signal.

5. A method according to claim 1 where the step of using an output of the ESR magnetometer includes mixing the acquired NMR imaging data with a signal derived from the output of the magnetometer.

6. A method according to claim 5 further including the steps of:

producing a signal whose frequency is a function of the output of the magnetometer; and combining the produced signal with an electron spin frequency of an ESR sample disposed in the magnetometer a proton resonance frequency of the object being imaged and the acquired NMR imaging data.

7. A method according to 5 further including the steps of:

exciting an ESR substance disposed in a resonator with an oscillating signal to produce a resonator signal;

demodulating and filtering the resonator signal, said oscillating signal and said demodulated and filtered resonator signal having an offset therebetween;

generating an offset signal on the output, said offset signal being proportional to the offset between the oscillating signal and the demodulated and filtered resonator signal; and combining the offset signal and the oscillating signal.

8. A method according to claim 1 where said magnetometer contains a dielectric resonator.

9. A method according to claim 1 where said magnetometer contains an organometallic compound with ESR linewidth less than $10^{-4}$ Tesla.

10. A method according to claim 1 where said magnetometer comprises:

a sample that resonates at an ESR frequency related to the strength of the fields acting on the sample; and an oscillator whose output frequency is a function of the ESR-frequency of the sample.

11. A method according to claim 10 including the step of modulating the sample.

12. A method according to claim 11 wherein the step of modulating the sample includes exciting the sample with a free frequency modulated excitation signal.

13. A method according to claim 12 wherein the step of modulating the sample further includes applying a modulating magnetic field to said sample.

14. A method according to claim 11 wherein the step of modulating the sample includes applying a modulating magnetic field to said sample.

15. A method according to claim 1 where said ESR magnetometer contains a ESR sensitive sample, said sample having a largest dimension of less than 5 mm.

16. A method according to claim 1 where said magnetometer is comprised of an ESR substance.

17. A method according to claim 16 where said ESR substance includes TCNQ (N-methyl-pyridinium).

18. A method according to claim 16 where said eliminating or compensating includes applying a compensating field on said substance.

19. A method according to claim 8 where the step of applying a compensating field includes feeding a current to a coil disposed near said substance.

20. A method for reducing the influence of instabilities on imaging data derived from an object in the presence of a static magnetic field at least one temporally varying applied gradient field, and temporally varying instabilities in the static field, said instabilities causing degradations in said imaging data, comprising the steps of monitoring the instabilities with an ESR magnetometer and reducing the influence of the instabilities on the imaging data.

* * * * *